United States Patent

Atsumi

(10) Patent No.: US 9,083,318 B2
(45) Date of Patent: Jul. 14, 2015

(54) DIGITALLY CONTROLLED OSCILLATOR AND OUTPUT FREQUENCY CONTROL METHOD

(71) Applicant: FUJITSU LIMITED, Kawasaki-shi, Kanagawa (JP)

(72) Inventor: Ken Atsumi, Sendai (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/204,409

(22) Filed: Mar. 11, 2014

(65) Prior Publication Data

US 2014/0306774 A1    Oct. 16, 2014

(30) Foreign Application Priority Data

Apr. 16, 2013    (JP) .................... 2013-086105

(51) Int. Cl.
*H03L 7/00* (2006.01)
*H03L 7/099* (2006.01)
*H03J 1/00* (2006.01)
*G06F 1/02* (2006.01)

(52) U.S. Cl.
CPC ............. *H03J 1/0008* (2013.01); *G06F 1/02* (2013.01); *H03L 7/00* (2013.01); *H03L 7/0991* (2013.01); *H03B 2200/009* (2013.01)

(58) Field of Classification Search
CPC ............ H03B 2200/0088; H03B 2200/009; H03L 7/00; H03L 7/099; H03L 7/0991
USPC ............ 327/146, 147, 150, 155, 156, 159; 331/1 A, 16, 17, 175, 177 R; 375/371, 375/373, 376
See application file for complete search history.

(56) References Cited

U.S. PATENT DOCUMENTS

| | | | | |
|---|---|---|---|---|
| 5,313,173 | A  * | 5/1994 | Lampe | 332/103 |
| 5,353,311 | A | 10/1994 | Hirata et al. | |
| 7,369,002 | B2 * | 5/2008 | Spijker et al. | 331/17 |
| 2001/0017574 | A1 * | 8/2001 | Oka | 331/116 R |
| 2008/0012647 | A1 * | 1/2008 | Risbo et al. | 331/16 |
| 2008/0284530 | A1 * | 11/2008 | Pellerano et al. | 331/1 A |
| 2009/0268791 | A1 * | 10/2009 | Waheed et al. | 375/219 |
| 2012/0032718 | A1 * | 2/2012 | Chan et al. | 327/156 |
| 2012/0119800 | A1 | 5/2012 | Yamasaki et al. | |
| 2012/0119839 | A1 * | 5/2012 | Takahashi et al. | 331/36 |

FOREIGN PATENT DOCUMENTS

JP   05-336181    12/1993
JP   2012-60395   3/2012

* cited by examiner

*Primary Examiner* — Levi Gannon
(74) *Attorney, Agent, or Firm* — Fujitsu Patent Center

(57) ABSTRACT

A digitally controlled oscillator that generates an output frequency according to input data includes a determination unit that determines whether the input data has a value that causes deterioration in a phase noise characteristic of the digitally controlled oscillator, an offset unit that offsets the input data when the input data is determined to have the value that causes deterioration in the phase noise characteristic, and a generating unit that generates the output frequency using the input data after being offset.

5 Claims, 8 Drawing Sheets

Related Art

Related Art

DIGITALLY CONTROLLED OSCILLATOR AND OUTPUT FREQUENCY CONTROL METHOD

CROSS-REFERENCE TO RELATED APPLICATION

This application is based upon and claims the benefit of priority of the prior Japanese Patent Application No. 2013-086105, filed on Apr. 16, 2013, the entire contents of which are incorporated herein by reference.

FIELD

The embodiments discussed herein are related to a digitally controlled oscillator and an output frequency control method.

BACKGROUND

Digitally controlled oscillators (DCO) control the output frequency using digital control. Some digitally controlled oscillators output a signal at a frequency $F_{out}$ according to output frequency control data that is input as a digital value. The output frequency control data which is input to such a digitally controlled oscillator is referred to as a "tuning word" (hereafter also referred to as the "TW").

FIG. 1 is a block diagram illustrating an example of the configuration of a conventional digitally controlled oscillator. As illustrated in FIG. 1, a conventional digitally controlled oscillator 90 has a crystal oscillator (X'tal Oscillator or XO) 91, an adder 92, an amplitude value acquisition unit 93, an amplitude value table 94, a digital to analog converter (DAC) 95, and a low-pass filter (LPF) 96.

The crystal oscillator 91 supplies an operation clock of frequency $F_S$ to the adder 92 and the DAC 95.

According to the operation clock of frequency $F_S$, the adder 92 having an N-bit length cyclically adds TWs which is input to the adder 92. That is, the adder 92 cyclically adds TWs with timing $T_S$ that is equivalent to the frequency $F_S$. The addition value outputted from the adder 92 is input back to the adder 92 and as well input to the amplitude value acquisition unit 93. The TW value is a digital value, so that the addition value outputted from the adder 92 is also a digital value. For example, the addition value outputted from the adder 92 increases with time as illustrated in FIG. 2. FIG. 2 is a diagram illustrating an example of output from the adder.

The amplitude value acquisition unit 93 acquires, from the amplitude value table 94, an amplitude value corresponding to an addition value input from the adder 92. In the amplitude value table 94, held are amplitude values of a sine wave for one period, each of the amplitude values being associated with each addition value from the minimum to the maximum addition values obtained by the adder 92. The amplitude value acquisition unit 93 refers to the amplitude value table 94 according to an addition value which is input to the amplitude value acquisition unit 93 and acquires an amplitude value corresponding to the addition value to output the amplitude value to the DAC 95. This amplitude value is a digital value.

The DAC 95 converts the digital amplitude value into an analog amplitude value according to the operation clock of the frequency $F_S$ and then outputs the converted analog amplitude value to the LPF 96. That is, the DAC 95 converts the amplitude value from digital to analog with the timing $T_S$ that is equivalent to the frequency $F_S$. Since each amplitude value of a sine wave for one period is held in the amplitude value table 94, the DAC 95 outputs a stepped sine wave as illustrated in FIG. 3. FIG. 3 is a diagram illustrating an example of output from the DAC. The one period $T_{out}$ of the sine wave is the reciprocal of the output frequency $F_{out}$ of the digitally controlled oscillator 90.

The LPF 96 filters out high-frequency components outputted by the DAC 95, that is, the high-frequency components of the stepped sine wave, and then outputs a sine wave with the high-frequency components filtered out. Thus, as illustrated in FIG. 4, the LPF 96 outputs a sine wave that has a period $T_{out}$ ($T_{out}=1/F_{out}$). FIG. 4 is a diagram illustrating an example of output from the LPF. The output of the LPF 96 serves as the output from the digitally controlled oscillator 90. That is, the digitally controlled oscillator 90 outputs a signal at a frequency of $F_{out}$.

Here, the output frequency $F_{out}$ from the digitally controlled oscillator 90 is defined by the TW value "TW," the bit length "N" of the adder 92, and the operation clock frequency "$F_S$," and expressed by Equation (1) below.

$$F_{out} = \frac{TW}{2^N} \cdot F_S [\text{Hz}] \tag{1}$$

Related-art examples are described, for example, in Japanese Laid-open Patent Publication No. 05-336181 and Japanese Laid-open Patent Publication No. 2012-060395.

FIGS. 5 and 6 illustrate the phase noise characteristics of the conventional digitally controlled oscillator 90 mentioned above. FIGS. 5 and 6 each are a diagram illustrating an example of an actually measured phase noise characteristic. FIG. 5 is an example of an actually measured phase noise characteristic when the TW value is such that TW=268,435,456, and $F_{out}$=10.886392 MHz. FIG. 6 is an example of an actually measured phase noise characteristic when the TW value is such that TW=268,432,771, and $F_{out}$=10.886288 MHz. In FIGS. 5 and 6, the horizontal axis represents the offset frequency corresponding to the output frequency $F_{out}$ and the vertical axis represents the strength of phase noise. In FIG. 5 with TW=268,435,456, relatively low spurious components about 10 to 20 in number are observed. In contrast to this, in FIG. 6 with TW=268,432,771, a number of relatively high spurious components are observed when compared with FIG. 5. Particularly, in FIG. 6, higher spurious components are found over the entire region near an offset frequency of 800 Hz or higher when compared with FIG. 5. As described above, the conventional digitally controlled oscillator 90 may have considerable increased spurious components for a particular TW, for example, for TW=268,432,771. That is, in the conventional digitally controlled oscillator 90 is found such a phenomenon that for a particular TW, the phase noise characteristic considerably deteriorates. Thus, for example, a data communication apparatus that employs the output from the conventional digitally controlled oscillator 90 as a clock will deteriorate in jitter characteristic at the time of data transmission or data reproduction at a particular output frequency of the digitally controlled oscillator 90.

SUMMARY

According to an aspect of an embodiment, A digitally controlled oscillator that generates an output frequency according to input data includes a determination unit that determines whether the input data has a value that causes deterioration in a phase noise characteristic of the digitally controlled oscillator, an offset unit that offsets the input data when the input data is determined to have the value that causes deterioration in the phase noise characteristic, and a generating unit that generates the output frequency using the input data after being offset.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. It is noted that the digitally controlled oscillator and the output frequency control method disclosed in the present application will not be limited by these embodiments. Furthermore, in each embodiment, like components will be denoted by like symbols and not repeatedly explained.

[a] First Embodiment

Example of Configuration of Digitally Controlled Oscillator

Figure 7:
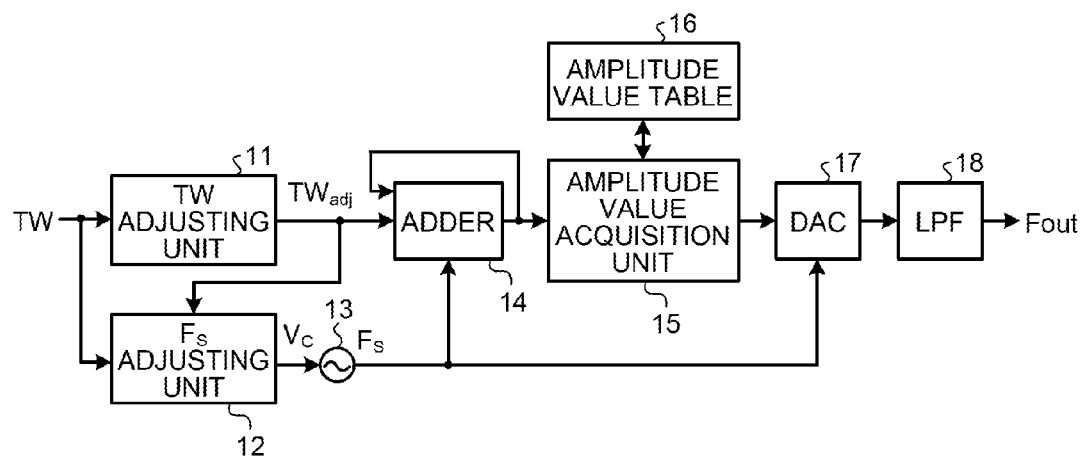
FIG. 7 is a block diagram illustrating an example of the configuration of a digitally controlled oscillator of a first embodiment.

FIG. 7 is a block diagram illustrating an example of the configuration of a digitally controlled oscillator of the first embodiment. In FIG. 7, a digitally controlled oscillator 10 has a TW adjusting unit 11, an $F_S$ adjusting unit 12, a voltage controlled oscillator (VCXO) 13, an adder 14, an amplitude value acquisition unit 15, an amplitude value table 16, a DAC 17, and an LPF 18. The digitally controlled oscillator 10 is used, for example, for a base station apparatus in a wireless communication system or other generally available electronic devices.

In FIG. 7, a TW is input from outside the digitally controlled oscillator 10 to the TW adjusting unit 11 and the $F_S$ adjusting unit 12.

The TW adjusting unit 11 adjusts the TW input from outside the digitally controlled oscillator 10 and then outputs a $TW_{adj}$ or a resulting TW to the $F_S$ adjusting unit 12 and the adder 14. That is, the TW adjusting unit 11 determines whether the TW has a value that causes deterioration in the phase noise characteristic of the digitally controlled oscillator 10. When the TW has a value that will not cause deterioration in the phase noise characteristic, the TW adjusting unit 11 outputs the TW as the $TW_{adj}$ with no change made thereto. On the other hand, when the TW has a value that causes deterioration in the phase noise characteristic, the TW adjusting unit 11 outputs the $TW_{adj}$ that has been generated by adding or subtracting a constant offset value to or from the TW. The TW adjusting unit 11 will be discussed in more detail later.

The $F_S$ adjusting unit 12 adjusts the frequency $F_S$ of the operation clock generated by the VCXO 13 according to the TW input from outside the digitally controlled oscillator 10 and the $TW_{adj}$ input from the TW adjusting unit 11. The $F_S$ adjusting unit 12 adjusts the frequency $F_S$ by varying a frequency control voltage $V_C$ for the VCXO 13. That is, the $F_S$ adjusting unit 12 determines whether the TW has a value that causes deterioration in the phase noise characteristic of the digitally controlled oscillator 10. The $F_S$ adjusting unit 12 outputs, to the VCXO 13, the frequency control voltage $V_C$ for the VCXO 13 to generate an operation clock having the center frequency of the VCXO 13 when the TW has a value that will not cause deterioration in the phase noise characteristic. On the other hand, when the TW has a value that causes deterioration in the phase noise characteristic, the $F_S$ adjusting unit 12 outputs, to the VCXO 13, the frequency control voltage $V_C$ for the VCXO 13 to generate an operation clock having a frequency shifted from the center frequency of the VCXO 13. The $F_S$ adjusting unit 12 will be discussed in more detail later.

The VCXO 13, which is a variable frequency oscillator, supplies the operation clock of frequency $F_S$ to the adder 14 and the DAC 17. The VCXO 13 varies the output frequency $F_S$ according to the frequency control voltage $V_C$ input from the $F_S$ adjusting unit 12.

Figure 1:
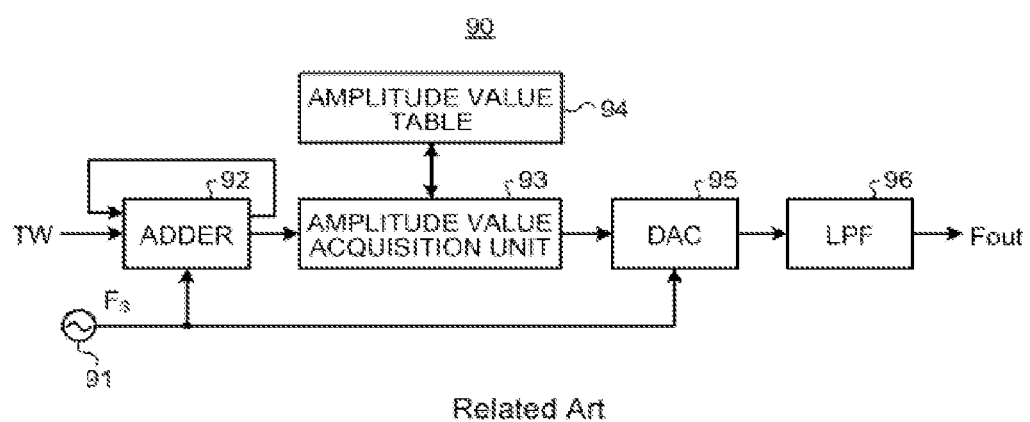
FIG. 1 is a block diagram illustrating an example of the configuration of a conventional digitally controlled oscillator.
Figure 2:
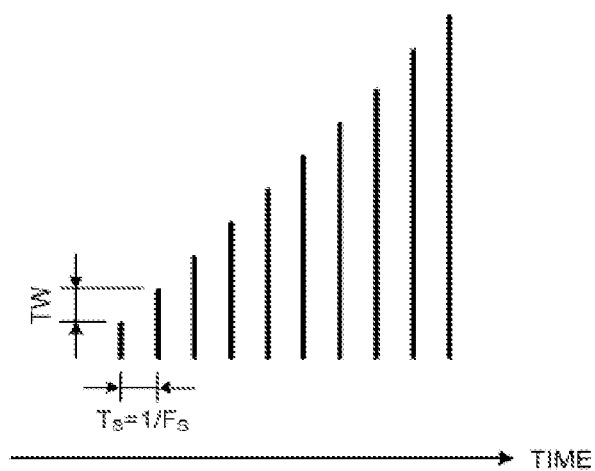
FIG. 2 is a diagram illustrating an example of output from an adder.

The adder 14 having an N-bit length adds the $TW_{adj}$, which is input to the adder 14, cyclically according to the operation clock of the frequency $F_S$. That is, the adder 14 cyclically adds the $TW_{adj}$ with the timing $T_S$ that is equivalent to the frequency $F_S$. The addition value delivered from the adder 14 is input back to the adder 14 and input to the amplitude value acquisition unit 15. Since the $TW_{adj}$ value is a digital value, the addition value outputted from the adder 14 is also a digital value. For example, the addition value outputted from the adder 14 is "the TW" of FIG. 2 above that is read for "the $TW_{adj}$."

The amplitude value acquisition unit 15 acquires, from the amplitude value table 16, an amplitude value corresponding to an addition value input from the adder 14. In the amplitude value table 16, held are amplitude values of a sine wave for one period, each of the amplitude values being associated with each addition value from the minimum to the maximum addition values obtained by the adder 14. The amplitude value acquisition unit 15 refers to the amplitude value table 16 according to an addition value which is input to the amplitude value acquisition unit 15 and acquires an amplitude value corresponding to the addition value to output the amplitude value to the DAC 17. This amplitude value is a digital value.

Figure 3:
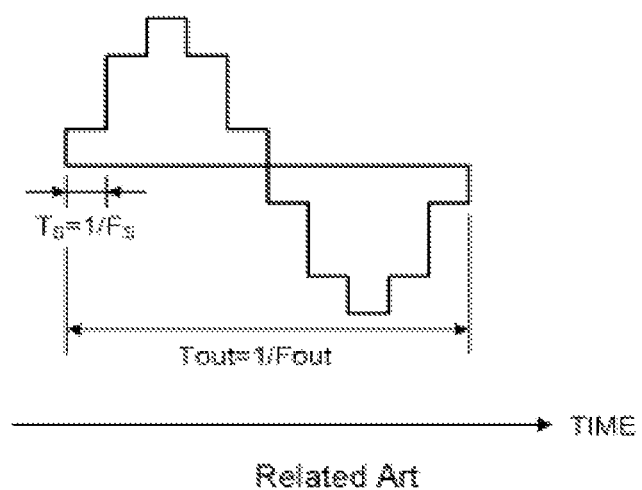
FIG. 3 is a diagram illustrating an example of output from a DAC.

The DAC 17 converts the digital amplitude value into an analog amplitude value according to the operation clock of the frequency $F_S$ and then outputs the converted analog amplitude value to the LPF 18. That is, the DAC 17 converts the amplitude value from digital to analog with the timing $T_S$ that is equivalent to the frequency $F_S$. Since each amplitude value of a sine wave for one period is held in the amplitude value table 16, the DAC 17 outputs a stepped sine wave as with the case illustrated in FIG. 3. The one period $T_{out}$ of the sine wave is the reciprocal of the output frequency $F_{out}$ of the digitally controlled oscillator 10.

Figure 4:
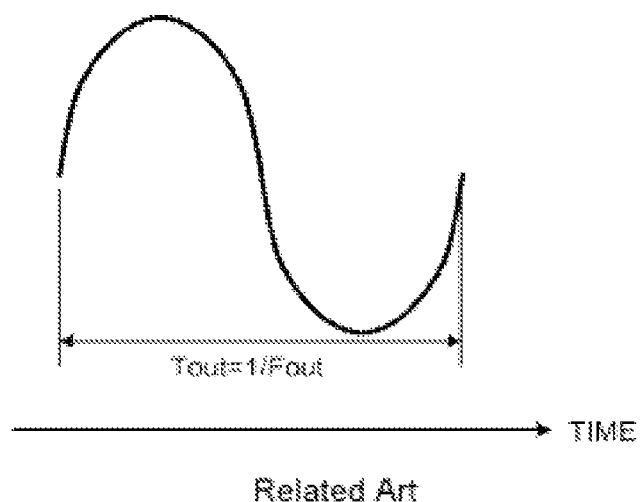
FIG. 4 is a diagram illustrating an example of output from an LPF.

The LPF 18 filters out high-frequency components outputted by the DAC 17, that is, the high-frequency components of the stepped sine wave, and then outputs a sine wave from which high-frequency components have been filtered out. Thus, the LPF 18 outputs a sine wave that has a period $T_{out}$ ($T_{out}=1/F_{out}$) as with the case illustrated in FIG. 4. The output from the LPF 18 serves as the output from the digitally controlled oscillator 10. That is, the digitally controlled oscillator 10 outputs a signal at a frequency of $F_{out}$.

That is, the adder 14, the amplitude value acquisition unit 15, the DAC 17, and the LPF 18 constitute an output frequency generating unit that generates the output frequency $F_{out}$ of the digitally controlled oscillator 10. Furthermore, the VCXO 13 supplies the operation clock of frequency $F_S$ to this output frequency generating unit.

Example of Configuration of TW Adjusting Unit

Figure 8:
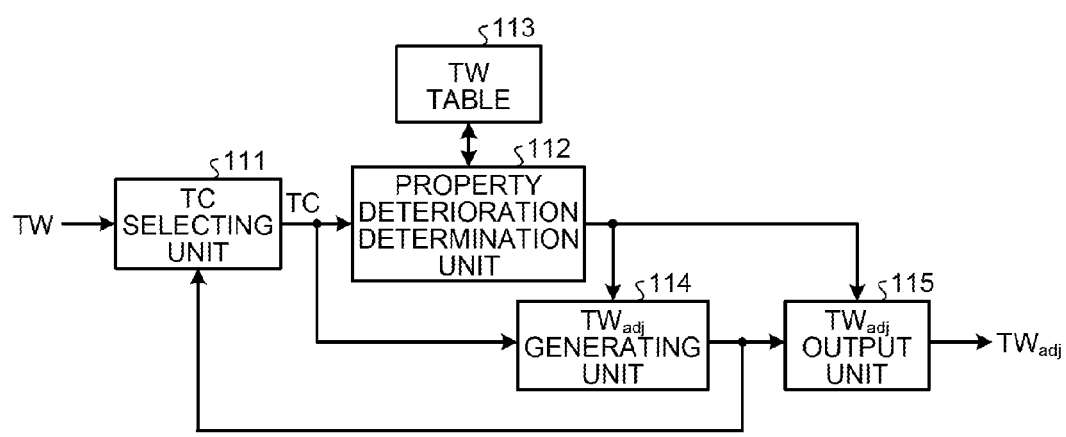
FIG. 8 is a block diagram illustrating an example of the configuration of a TW adjusting unit of the first embodiment.

FIG. 8 is a block diagram illustrating an example of the configuration of the TW adjusting unit of the first embodiment. In FIG. 8, the TW adjusting unit 11 has a TC selecting unit 111, a property deterioration determination unit 112, a TW table 113, a $TW_{adj}$ generating unit 114, and a $TW_{adj}$ output unit 115.

The TC selecting unit 111 is supplied with a TW from outside the digitally controlled oscillator 10 and the $TW_{adj}$ from the $TW_{adj}$ generating unit 114.
The TC selecting unit 111 compares a previously input TW with a currently input TW, and when the input TW has been updated, selects the currently input TW as a TC for output to the property deterioration determination unit 112 and the $TW_{adj}$ generating unit 114. On the other hand, when the input TW has not been updated, the TC selecting unit 111 selects the $TW_{adj}$ as a TC for output to the property deterioration determination unit 112 and the $TW_{adj}$ generating unit 114.

Figure 5:
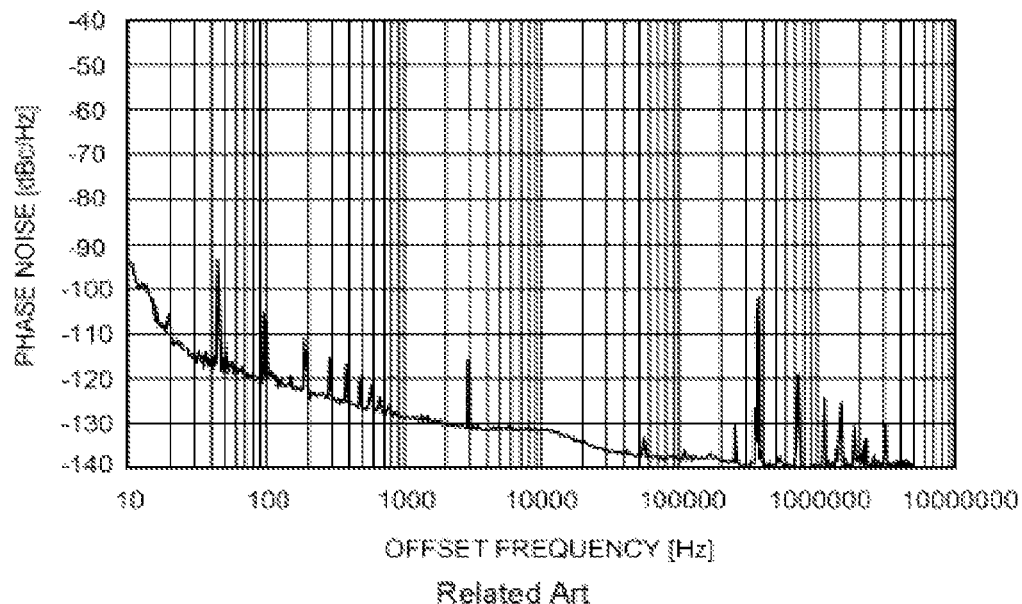
FIG. 5 is a diagram illustrating an example of an actually measured phase noise characteristic.
Figure 6:
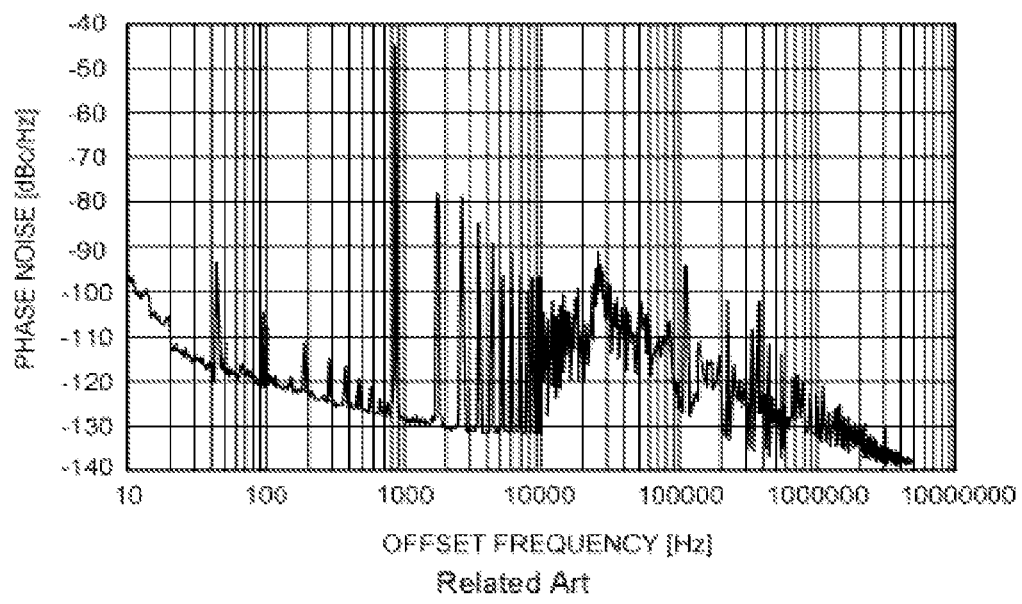
FIG. 6 is a diagram illustrating an example of an actually measured phase noise characteristic.

The property deterioration determination unit 112 refers to the TW table in accordance with the input TC so as to determine whether the TC has a value that causes deterioration in the phase noise characteristic of the digitally controlled oscillator 10. In the TW table 113, a TW that causes deterioration in the phase noise characteristic is pre-stored. The TW is set to the TW table 113 by measuring the phase noise characteristic of the digitally controlled oscillator 10 in advance. For example, when an example of an actually measured phase noise characteristic is as illustrated above in FIGS. 5 and 6, "TW=268,432,771" is pre-set to and stored in the TW table 113 as a TW that causes deterioration in the phase noise characteristic. The property deterioration determination unit 112 determines that deterioration in the phase noise characteristic occurs when the TC corresponds to any one of the TWs stored in the TW table 113, while determining that no deterioration in the phase noise characteristic occurs when the TC does not correspond to any one of the TWs stored in the TW table 113. Then, the property deterioration determination unit 112 outputs the determination result to the $TW_{adj}$ generating unit 114 and the $TW_{adj}$ output unit 115. The property deterioration determination unit 112 outputs "a determination result=1" when having determined that deterioration in the phase noise characteristic occurs and "a determination result=0" when having determined that no deterioration in the phase noise characteristic occurs. Note that it is acceptable to set, to the TW table 113, either one or more TWs or a range of TWs.

The $TW_{adj}$ generating unit 114 produces the $TW_{adj}$ with the $TW_{adj}$=TC when the determination result is "0," that is, the TC has a value that does not cause deterioration in the phase noise characteristic. On the other hand, the $TW_{adj}$ generating unit 114 adds or subtracts an offset dT to or from the TC to produce the $TW_{adj}$ when the determination result is "1" that is, the TC has a value that causes deterioration in the phase noise characteristic. Either the addition or the subtraction is employed as a result of a comparison in magnitude between the TC and a reference value $TW_0$. That is, the $TW_{adj}$ generating unit 114 generates the $TW_{adj}$ such that $TW_{adj}$=TC−dT when the TC is equal to or greater than $TW_0$, while generating the $TW_{adj}$ such that $TW_{adj}$=TC+dT when the TC is less than the $TW_0$. The $TW_{adj}$ generating unit 114 outputs the resulting $TW_{adj}$ to the $TW_{adj}$ output unit 115 and the TC selecting unit 111.

Here, the reference value $TW_0$ is set to the $TW_{adj}$ generating unit 114 in advance according to Equation (2). In Equation (2), $F_{out0}$ is the center value in the range of frequencies that the digitally controlled oscillator 10 can output; $F_{S0}$ is the center value in the range of frequencies that the VCXO 13 can output; and N is the bit length of the adder 14.

$$TW_0 = \frac{2^N}{F_{S0}} \cdot F_{out0} \quad (2)$$

Furthermore, the offset dT is adapted such that arbitrary values with a minimum value of 1 are set to the $TW_{adj}$ generating unit 114 in advance. The dT is preferably set to have approximately 10 to 1000 times the resolution setting of the output frequency of the digitally controlled oscillator 10.

The $TW_{adj}$ output unit 115 outputs the $TW_{adj}$ input from the $TW_{adj}$ generating unit 114 to the adder 14 and the $F_S$ adjusting unit 12 when the determination result is "0," that is, when the TC has a value that causes no deterioration in the phase noise characteristic. On the other hand, when the determination result is "1," that is, when the TC has a value that causes deterioration in the phase noise characteristic, the $TW_{adj}$ output unit 115 does not output the $TW_{adj}$ input from the $TW_{adj}$ generating unit 114.

That is, when the TW input from outside the digitally controlled oscillator 10 has a value that causes deterioration in the phase noise characteristic, the TW adjusting unit 11 imparts the offset dT to the TW, thereby updating the TW to a value that will not cause any deterioration in the phase noise characteristic. This update is performed by repeatedly imparting the dT to the TW until the TW has a value that causes no deterioration in the phase noise characteristic. Then, at the point in time at which the TW is updated to a value that causes no deterioration in the phase noise characteristic, the TW adjusting unit 11 outputs the resulting TW, that is, the $TW_{adj}$ to the adder 14 and the $F_S$ adjusting unit 12.

<Example of Configuration of $F_S$ Adjusting Unit>

Figure 9:
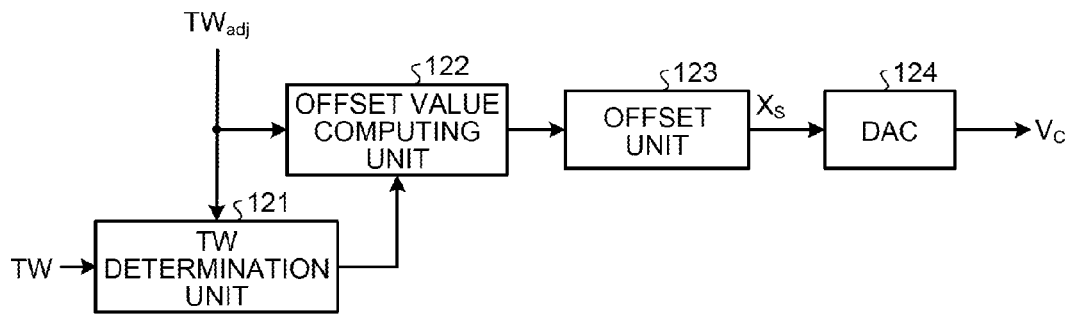
FIG. 9 is a block diagram illustrating an example of the configuration of an $F_S$ adjusting unit of the first embodiment.

FIG. 9 is a block diagram illustrating an example of the configuration of the $F_S$ adjusting unit of the first embodiment. In FIG. 9, the $F_S$ adjusting unit 12 has a TW determination unit 121, an offset value computing unit 122, an offset unit 123, and a DAC 124.

The TW determination unit 121 is supplied with a TW from outside the digitally controlled oscillator 10 and a $TW_{adj}$ from the TW adjusting unit 11. The $TW_{adj}$ input from the TW adjusting unit 11 is equivalent to the TW that causes no deterioration in the phase noise characteristic. The TW determination unit 121 compares the TW input from outside the digitally controlled oscillator 10 with the $TW_{adj}$ input from the TW adjusting unit 11 and then determines whether the TW input from outside the digitally controlled oscillator 10 has a value that causes deterioration in the phase noise characteristic. When $TW=TW_{adj}$, the TW determination unit 121 determines that the TW has a value that causes no deterioration in the phase noise characteristic, and then outputs "the determination result=0" to the offset value computing unit 122. On the other hand, when Tw is not equal to the $TW_{adj}$, the TW determination unit 121 determines that the TW has a value that causes deterioration in the phase noise characteristic, and then outputs "the determination result=1" to the offset value computing unit 122.

The offset value computing unit 122 is supplied with the $TW_{adj}$ from the TW adjusting unit 11. The offset value computing unit 122 sets the offset value X so that X=0 when the determination result is "0," that is, when the TW has a value that causes no deterioration in the phase noise characteristic. On the other hand, the offset value computing unit 122 computes the offset value X according to Equation (3) when the determination result is "1," that is, when the TW has a value that causes deterioration in the phase noise characteristic. Note that "α" in Equation (3) is expressed by Equation (4). Furthermore, in Equation (3), "$K_V$" is the frequency control sensitivity of the VCXO 13; "$K_D$" is the resolution of the DAC 124; and "$f_0$" is the center frequency of the VCXO 13. That is, the offset value computing unit 122 computes the offset value X according to the ratio between the TW and the $TW_{adj}$ when the TW input from outside the digitally controlled oscillator 10 has a value that causes deterioration in the phase noise characteristic. The offset value computing unit 122 outputs the offset value X to the offset unit 123.

$$X = \frac{\alpha - 1}{K_V \cdot K_D} \cdot f_0 \quad (3)$$

$$\alpha = \frac{TW}{TW_{adj}} \quad (4)$$

The offset unit 123 adds the offset value X to a reference value X0 that corresponds to the center frequency of the VCXO 13 so as to generate a digital value $X_S$ for controlling the output frequency $F_S$ of the VCXO 13, and outputs the resulting $X_S$ to the DAC 124. That is, the digital value $X_S$ is determined such that $X_S=X0+X$. Thus, when the TW input from outside the digitally controlled oscillator 10 has a value that causes no deterioration in the phase noise characteristic, the offset unit 123 sets the digital value for controlling the output frequency $F_S$ to X0, thereby not shifting the output frequency $F_S$ from the center frequency of the VCXO 13. On the other hand, when the TW input from outside the digitally controlled oscillator 10 has a value that causes deterioration in the phase noise characteristic, the offset unit 123 offsets the reference value X0 by X, thereby shifting the output frequency $F_S$ from the center frequency of the VCXO 13 by an amount equivalent to X.

The DAC 124 converts the digital value $X_S$ into an analog value $V_C$ according to Equation (5) and outputs the analog value $V_C$ to the VCXO 13.

This analog value $V_C$ serves as the frequency control voltage that controls the output frequency $F_S$ of the VCXO 13.

$$V_C = K_D \cdot X_S \quad (5)$$

<Processing of Digitally Controlled Oscillator>

Figure 10:
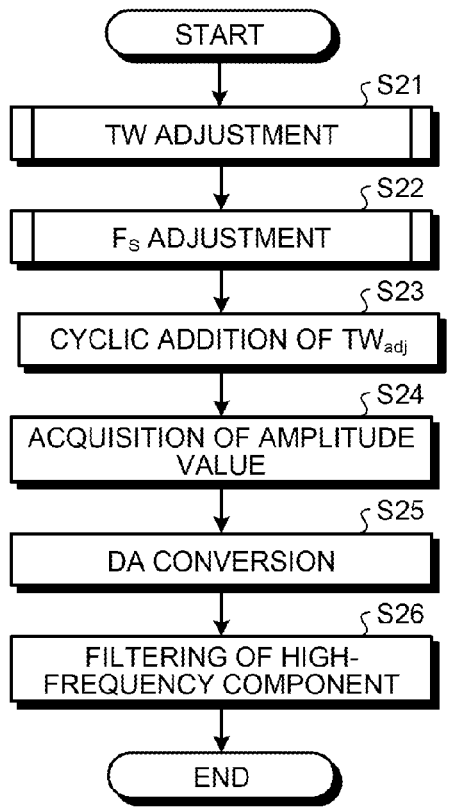
FIG. 10 is an explanatory flowchart for describing the processing of a digitally controlled oscillator of the first embodiment.

FIG. 10 is an explanatory flowchart for describing the processing of the digitally controlled oscillator of the first embodiment.

First, the TW adjusting unit 11 performs a TW adjustment (step S21). The TW adjustment will be discussed later.

Then, the $F_S$ adjusting unit 12 performs an $F_S$ adjustment (step S22). The $F_S$ adjustment will be discussed later.

Then, the adder 14 cyclically adds the $TW_{adj}$ input from the TW adjusting unit 11 according to the operation clock of the frequency $F_S$ (step S23).

Then, the amplitude value acquisition unit 15 acquires, from the amplitude value table 16, an amplitude value corresponding to an addition value input from the adder 14 (step S24).

Then, the DAC 17 converts a digital amplitude value into an analog amplitude value according to the operation clock of the frequency $F_S$ (step S25).

Then, the LPF 18 filters out high-frequency components outputted by the DAC 17, that is, the high-frequency components of the stepped sine wave, and then outputs a signal at a frequency $F_{out}$ that is a sine wave with the high-frequency components filtered out (step S26).

Processing of TW Adjusting Unit

Figure 11:
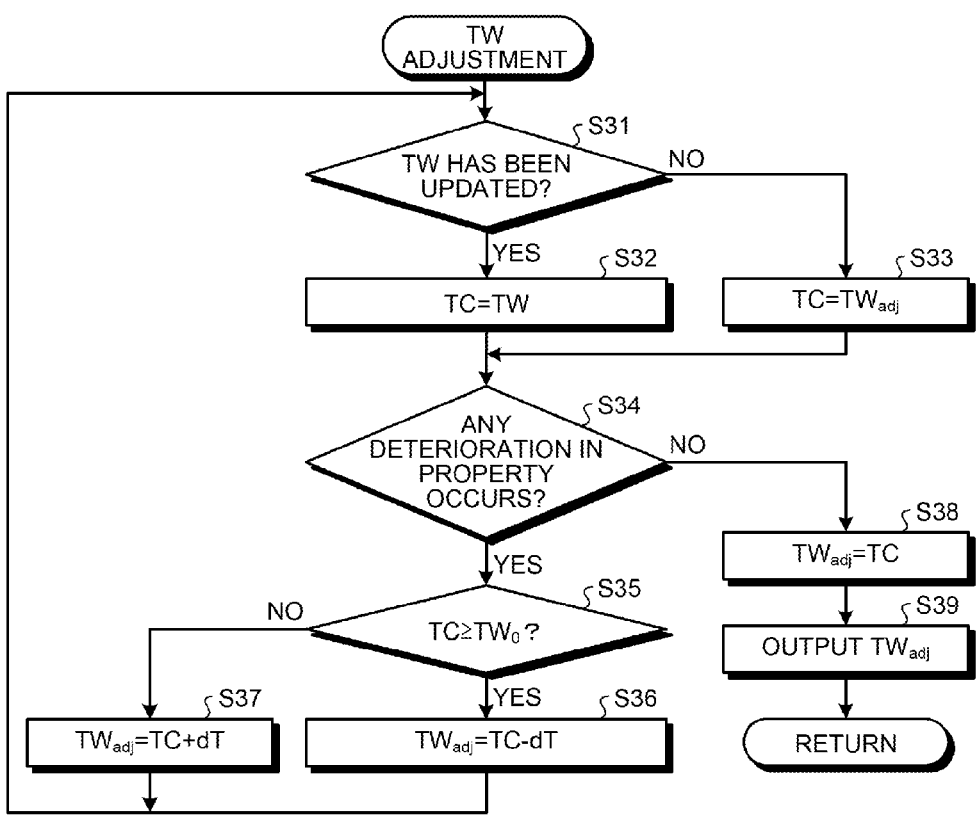
FIG. 11 is an explanatory flowchart for describing the processing of a TW adjusting unit of the first embodiment.

FIG. 11 is an explanatory flowchart for describing the processing of the TW adjusting unit of the first embodiment. That is, FIG. 11 illustrates a flowchart of the TW adjustment of FIG. 10 (step S21).

First, the TC selecting unit 111 determines whether the TW input from outside the digitally controlled oscillator 10 has been updated (step S31). When the TW has been updated (Yes in step S31), the TC selecting unit 111 selects the TW as a TC such that TC=TW (step S32). On the other hand, when the TW has not been updated (No in step S31), the TC selecting unit 111 selects the $TW_{adj}$ as the TC such that $TC=TW_{adj}$ (step S33).

Then, the property deterioration determination unit 112 determines whether the input TC, that is, the TW or the $TW_{adj}$ has a value that causes deterioration in the phase noise characteristic of the digitally controlled oscillator 10. That is, when the input TC has been added by the adder 14, the property deterioration determination unit 112 determines whether deterioration in the phase noise characteristic occurs (step S34).

When the property deterioration determination unit 112 has determined that deterioration in the phase noise characteristic does not occur (No in step S34), the $TW_{adj}$ generating unit 114 sets such that $TW_{adj}$=TC (step S38), and the $TW_{adj}$ output unit 115 outputs the $TW_{adj}$ to the $F_S$ adjusting unit 12 (step S39). After the $TW_{adj}$ has been outputted to the $F_S$ adjusting unit 12, the process proceeds to step S22 of FIG. 10.

On the other hand, when the property deterioration determination unit 112 has determined that deterioration in the phase noise characteristic occurs (Yes in step S34), the $TW_{adj}$ generating unit 114 determines whether the TC is equal to or greater than the reference value $TW_0$ (step S35). When the TC is equal to or greater than the reference value $TW_0$ (Yes in step S35), the $TW_{adj}$ generating unit 114 employs "TC−dT" as the $TW_{adj}$ (step S36). On the other hand, when the TC is less than the reference value $TW_0$ (No in step S35), the $TW_{adj}$ generating unit 114 employs "TC+dT" as the $TW_{adj}$ (step S37). After the processing in step S36 or step S37, the process of the TW adjusting unit 11 returns to step S31.

Processing of $F_S$ Adjusting Unit

Figure 12:
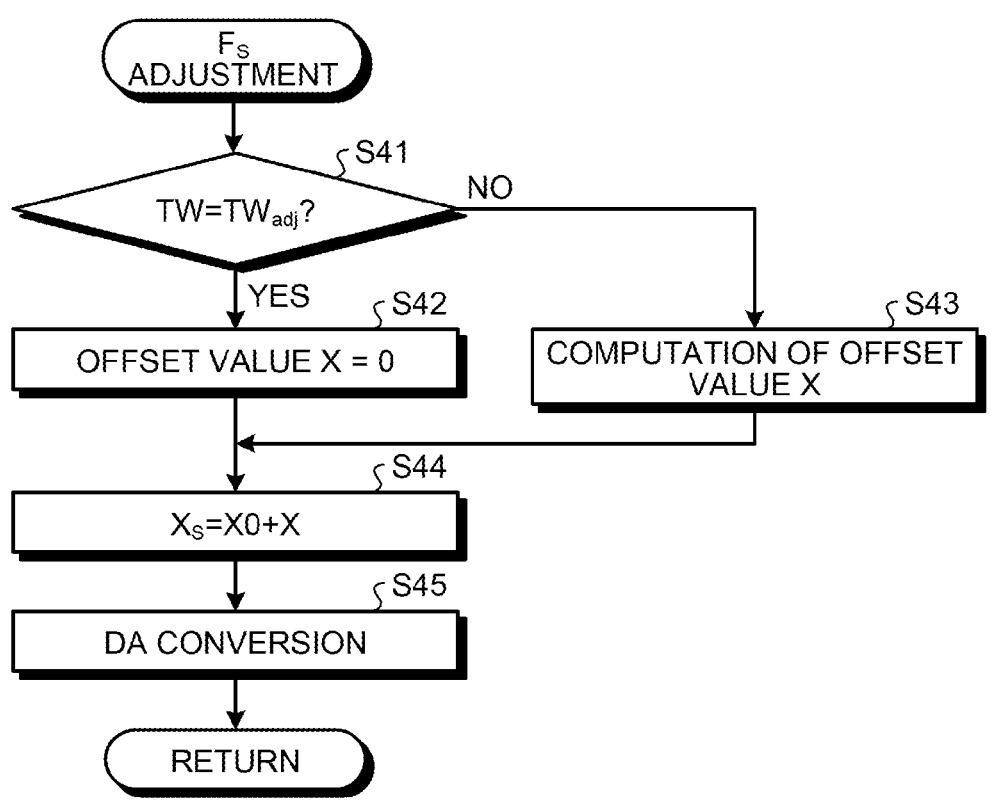
FIG. 12 is an explanatory flowchart for describing the processing of the $F_S$ adjusting unit of the first embodiment.

FIG. 12 is an explanatory flowchart for describing the processing of the $F_S$ adjusting unit of the first embodiment. That is, FIG. 12 illustrates a flowchart of the $F_S$ adjustment of FIG. 10 (step S22).

First, the TW determination unit 121 determines whether the TW input from outside the digitally controlled oscillator 10 has the same value as that of the $TW_{adj}$ input from the TW adjusting unit 11, that is, whether $TW=TW_{adj}$ (step S41).

When $TW=TW_{adj}$ (Yes in step S41), the offset value computing unit 122 sets the offset value X to 0 (step S42). On the other hand, when TW is not equal to $TW_{adj}$ (No in step S41), the offset value computing unit 122 computes the offset value X according to Equations (3) and (4) (step S43).

Then, the offset unit 123 adds the offset value X to the reference value X0 so as to produce the digital value $X_S=X0+X$ for controlling the output frequency $F_S$ of the VCXO 13 (step S44).

Then, the DAC 124 generates the frequency control voltage $V_C$ for the VCXO 13 by converting the digital value $X_S$ into an analog value according to Equation (5) and outputs the resulting VC to the VCXO 13 (step S45). After the $V_C$ has been outputted to the VCXO 13, the process proceeds to step S23 of FIG. 10.

Specific Example of Processing by Digitally Controlled Oscillator

Now, a description will be made to the specific processing performed by the digitally controlled oscillator 10 outputting a signal at a desired output frequency "$F_{out}$=10.886288 MHz" when the digitally controlled oscillator 10 is supplied with "TW=268,432,771" that causes deterioration in the phase noise characteristic. Here, it is assumed that the VCXO 13 has a center frequency $f_0$=174.182350 MHz, and the VCXO 13 has a frequency control sensitivity $K_V$=2000 Hz/V. Furthermore, the adder 14 has a bit length N=32 bit, and the DAC 124 has a resolution $K_D$=50 µV. It is also assumed that the reference value $TW_0$=268,400,000, the offset dT=128, and the reference value X0=32,768.

When the digitally controlled oscillator 10 is supplied with TW=268,432,771 as a new TW value, in the TW adjusting unit 11, the TC selecting unit 111 selects the TW as a TC and output TC=268,432,771 to the property deterioration determination unit 112 and the $TW_{adj}$ generating unit 114.

Then, the property deterioration determination unit 112 determines that TC=268,432,771 corresponds to TW=268,432,771 that is set in the TW table 113. That is, the property deterioration determination unit 112 determines that TC=268,432,771 is a value that causes deterioration in the phase noise characteristic, and then outputs the determination result=1 to the $TW_{adj}$ generating unit 114 and the $TW_{adj}$ output unit 115.

Then, the $TW_{adj}$ generating unit 114 generates the $TW_{adj}$ as $TW_{adj}$=TC−dT because the input determination result is "1" and TC=268,432,771 is equal to or greater than the reference value $TW_0$=268,400,000. That is, the $TW_{adj}$ generating unit 114 generates $TW_{adj}$=268,432,771−128=268,432,643 for output to the TC selecting unit 111 and the $TW_{adj}$ output unit 115.

Furthermore, since the input determination result is "1," the $TW_{adj}$ output unit 115 does not output the $TW_{adj}$.

Then, the TC selecting unit 111 selects, as a TC, $TW_{adj}$=268,432,643 input from the $TW_{adj}$ generating unit 114, and then outputs TC=268,432,643 to the property deterioration determination unit 112 and the $TW_{adj}$ generating unit 114.

From here onward, the $TW_{adj}$ generating unit 114 repeatedly subtracts dT from the $TW_{adj}$ until the property deterioration determination unit 112 provides a determination result of "0."

Then, suppose that when TC=268,430,083 is reached by repeatedly subtracting dT from $TW_{adj}$, the property deterioration determination unit 112 provides a determination result of "0," that is, the TC has a value that causes no deterioration in the phase noise characteristic. Then, the $TW_{adj}$ generating unit 114 sets $TW_{adj}$=TC=268,430,083, while the $TW_{adj}$ output unit 115 outputs $TW_{adj}$=268,430,083 to the adder 14 and the $F_S$ adjusting unit 12.

Next, in the $F_S$ adjusting unit 12, the TW determination unit 121 outputs the determination result "1" to the offset value computing unit 122 because $TW_{adj}$=268,430,083 for TW=268,432,771.

Then, since the input determination result is "1," the offset value computing unit 122 computes an offset value X=17,320 according to Equations (3) and (4) for output to the offset unit 123.

Then, the offset unit 123 adds X=17,320 to X0=32,768 so as to generate $X_S$=50,088 for output to the DAC 124.

Then, the DAC 124 generates the frequency control voltage $V_C$=2.52211 V according to Equation (5) for output to the VCXO 13.

Then, the VCXO 13 generates the operation clock of the frequency $F_S$=174.184094 MHz according to the input $V_C$=2.52211 V and then supplies the operation clock to the adder 14 and the DAC 17.

Here, $TW_{adj}$=268,430,083, which is input to the adder 14 from the $TW_{adj}$ output unit 115, is a value that causes no deterioration in the phase noise characteristic. At this time, the output frequency $F_{out}$ of the digitally controlled oscillator 10 is as described by Equation (6), and the digitally controlled oscillator 10 can generate a signal at an initially desired output frequency $F_{out}$=10.886288 MHz from the $TW_{adj}$ that causes no deterioration in the phase noise characteristic. That is, it is possible to prevent deterioration in the phase noise characteristic while maintaining whatever is the desired output frequency $F_{out}$.

$$F_{out} = \frac{TW_{adj}}{2^N} \cdot F_s \qquad (6)$$
$$= \frac{268{,}430{,}083}{2^{32}} \cdot 174{,}184{,}094 \text{ Hz}$$
$$= 10.886288 \text{ MHz}$$

As described above, the digitally controlled oscillator 10 determines whether the TW or input data has a value that causes deterioration in phase noise characteristic, and then offsets the TW when the TW is determined to have a value that causes deterioration in phase noise characteristic. Then, the digitally controlled oscillator 10 generates an output frequency using the TW after being offset.

Since this enables to convert the TW into a value that causes no deterioration in phase noise characteristic, it is possible to prevent deterioration in phase noise characteristic.

Furthermore, the digitally controlled oscillator 10 has a table in which a TW value that causes deterioration in phase noise characteristic has been set in advance. When an input TW corresponds to a TW value that has been set in the table, the digitally controlled oscillator 10 determines that the input TW has a value that causes deterioration in phase noise characteristic.

This makes it possible to facilitate identification of the TW that causes deterioration in phase noise characteristic.

Furthermore, when the digitally controlled oscillator 10 determines that the TW has a value that causes deterioration in phase noise characteristic, the digitally controlled oscillator 10 adjusts the frequency of the operation clock for generating an output frequency according to the ratio between the TW before being offset and the TW after being offset.

Since this enables to adjust the frequency of the operation clock according to the amount of offset of the TW, it is possible to maintain the desired output frequency even when the TW is offset.

Furthermore, the digitally controlled oscillator 10 adjusts the frequency of the operation clock by computing the frequency control voltage for the VCXO 13 according to the ratio between the TW before being offset and the TW after being offset.

This makes it possible to facilitate adjustment of the frequency of the operation clock.

[b] Other Embodiments

Figure 13:
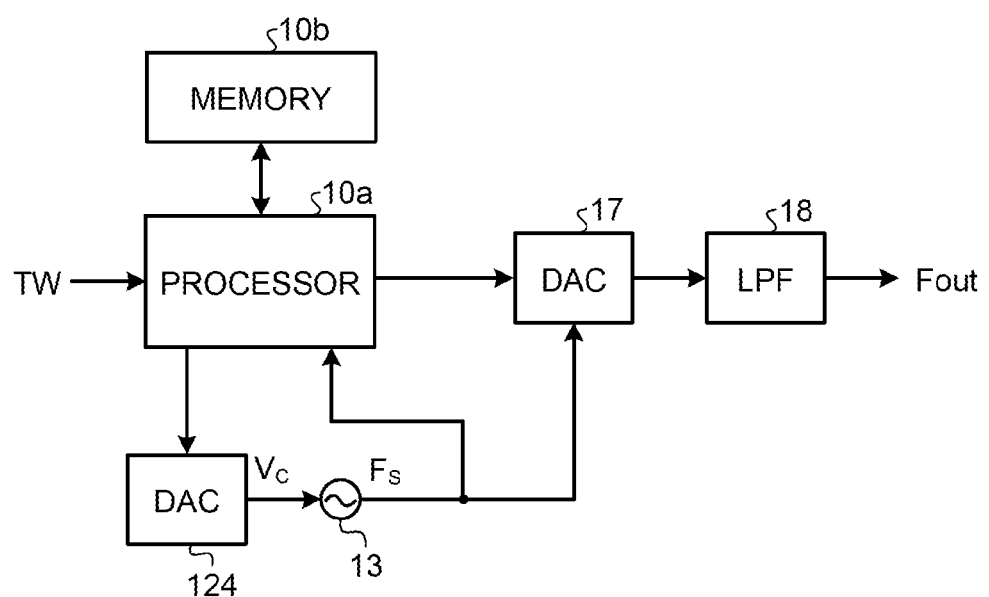
FIG. 13 is a diagram illustrating an example of the hardware configuration of a digitally controlled oscillator.

[1] The aforementioned digitally controlled oscillator 10 can be achieved by the following hardware structure. FIG. 13 is a diagram illustrating an example of the hardware structure of the digitally controlled oscillator. As illustrated in FIG. 13, the digitally controlled oscillator 10 has, as the hardware components thereof, a processor 10a, a memory 10b, the DAC 124, the VCXO 13, the DAC 17, and the LPF 18. Examples of the processor 10a may include a central processing unit (CPU), a digital signal processor (DSP), or a field programmable gate array (FPGA).

Furthermore, the digitally controlled oscillator 10 may also have a large scale integrated circuit (LSI) that includes both the processor 10a and the peripheral circuits. Examples of the memory 10b may include RAMs such as SDRAMs, ROMs, and flash memory devices. The adder 14, the amplitude value acquisition unit 15, the TC selecting unit 111, the property deterioration determination unit 112, the $TW_{adj}$ generating unit 114, the $TW_{adj}$ output unit 115, the TW determination unit 121, the offset value computing unit 122, and the offset unit 123 are achieved by the processor 10a. The amplitude value table 16 and the TW table 113 are stored in the memory 10b.

[2] The each processing described in the first embodiment may also be achieved by allowing the processor 10a to execute a program that has been prepared in advance. For example, a program corresponding to each processing described above may also be stored in the memory 10b in advance, so that each program may be read from the memory 10b and executed by the processor 10a.

According to an aspect of the disclosure, it is possible to prevent deterioration in phase noise characteristic.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A digitally controlled oscillator that generates an output frequency according to input data, the digitally controlled oscillator comprising:
    a determination unit that determines whether the input data has a value that causes deterioration in a phase noise characteristic of the digitally controlled oscillator;
    an offset unit that offsets the input data when the input data is determined to have the value that causes deterioration in the phase noise characteristic;
    a generating unit that generates the output frequency using the input data after being offset;
    a supply unit that supplies an operation clock to the generating unit; and
    an adjusting unit that, when the input data is determined to have the value that causes deterioration in the phase noise characteristic, adjusts a frequency of the operation clock according to an offset amount of the input data in the offset unit.

2. The digitally controlled oscillator according to claim 1, further comprising a table in which an input data value that causes deterioration in the phase noise characteristic is set in advance, wherein
    when the input data corresponds to the input data value that is set in the table, the determination unit determines that the input data has the value that causes deterioration in the phase noise characteristic.

3. The digitally controlled oscillator according to claim 1, wherein
    the adjusting unit computes an adjustment value for the frequency of the operation clock based on a ratio between the input data before being offset and the input data after being offset.

4. The digitally controlled oscillator according to claim 3, wherein
    the supply unit supplies, to the generating unit, the operation clock having a frequency according to a frequency control voltage which is input to the supply unit; and
    the adjusting unit adjusts the frequency of the operation clock by computing the frequency control voltage as the adjustment value according to the ratio.

5. An output frequency control method for a digitally controlled oscillator that generates an output frequency according to input data, the method comprising:
    determining whether the input data has a value that causes deterioration in a phase noise characteristic of the digitally controlled oscillator;
    offsetting the input data when the input data is determined to have the value that causes deterioration in the phase noise characteristic;
    generating the output frequency using the input data after being offset;
    supplying an operation clock for the generating; and
    adjusting, when the input data is determined to have the value that causes deterioration in the phase noise characteristic, a frequency of the operation clock according to an offset amount of the input data in the offsetting.

* * * * *